United States Patent [19]
Baums et al.

[11] Patent Number: 5,313,478
[45] Date of Patent: May 17, 1994

[54] METHOD OF OPERATING A SEMICONDUCTOR LASER AS A MODE-LOCKED SEMICONDUCTOR LASER AND DEVICES FOR IMPLEMENTING THE METHOD

[75] Inventors: Dieter Baums, Ludwigsburg; Kaspar Dütting; Olaf Hildebrand, both of Stuttgart; Wilfried Idler, Asperg; Gert Laube, Stuttgart; Michael Schilling, Stuttgart; Heinz Schweizer, Stuttgart; Klaus Wünstel, Schwieberdingen, all of Fed. Rep. of Germany

[73] Assignee: Alcatel N.V., Amsterdam, Netherlands

[21] Appl. No.: 884,341

[22] Filed: May 18, 1992

[30] Foreign Application Priority Data

May 31, 1991 [DE] Fed. Rep. of Germany ....... 4117866

[51] Int. Cl.⁵ ........................ H01S 3/098; H01S 3/10
[52] U.S. Cl. ...................... 372/26; 372/18; 372/46; 372/50
[58] Field of Search .................. 372/18, 26, 46, 50

[56] References Cited

U.S. PATENT DOCUMENTS

5,105,433 4/1992 Eisele et al. ........................... 372/50
5,200,969 4/1993 Paoli ...................................... 372/50

FOREIGN PATENT DOCUMENTS

58-202581 3/1984 Japan.
1-168086 7/1989 Japan.

OTHER PUBLICATIONS

"Long-Wavelength Semiconductor Lasers" G. P. Agrawal; 1986, Van Nostrand Reinhold, New York, pp. 367–369.
Unpublished U.S. application Ser. No. 07/980,958, filed Nov. 24th, 1992, Attorney Docket No. ALCAT 0318, status–pending.
Unpublished U.S. application Ser. No. 07/966,030, filed Dec. 24th, 1992, Attorney Docket No. ALCAT 0317 status–pending.
Unpublished U.S. application Ser. No. 07/935,885, filed Aug. 27th, 1992, assigned to Group Art Unit 2503, Attorney Docket No. ALCAT 03131, status–pending.
16th European Conference on Optical Communication, Sep. 16–20, 1990, vol. 1, pp. 479–482; W. Idler et al.: "High speed integrated . . . ".
Schilling et al., "Widely Tunable Y-Coupled Cavity Integrated Interferometric Injection Laser," *Electronics Letters*, vol. 26, No. 4, Feb. 15, 1990, pp. 243–244.
Salzman et al., "Cross Coupled Cavity Semiconductor Laser," *Appl. Phys. Lett.* 52 (10), Mar. 7, 1988, pp. 767–769.
Tsang, "Extremely Low Threshold (AlGa) as Modified Multiquantum Well Heterostructure Lasers Grown by Molecular-Beam Epitaxy," *Appl. Phys. Lett.* 39 (10), Nov. 15, 1981, pp. 786–788.
Wu et al., "Transform-Limited 1.4 ps Optical Pulses from a Monolithic Colliding-Pulse Mode-Locked Quantum Well Laser," *Appl. Phys. Lett.* 57 (8), Aug. 20, 1990, pp. 759–760.

*Primary Examiner*—James W. Davie
*Attorney, Agent, or Firm*—Spencer, Frank & Schneider

[57] ABSTRACT

A semiconductor laser that is monolithically integrated on a substrate and whose cavity has a branched structure that is simply contiguous in a topological sense, and which includes a plurality of regions that enclose the cavity, is operated as a mode-locked semiconductor laser, with an alternating current flowing through at least one region in addition to a direct current. The frequency of the alternating current is related to the reciprocal of the round-trip time or an integral multiple of this reciprocal of light pulses generated by the alternating current in the semiconductor laser.

12 Claims, 2 Drawing Sheets

METHOD OF OPERATING A SEMICONDUCTOR LASER AS A MODE-LOCKED SEMICONDUCTOR LASER AND DEVICES FOR IMPLEMENTING THE METHOD

CROSS REFERENCE TO RELATED APPLICATION

This application claims the priority of Application Ser. No. P 41 17 866.1, filed May 31, 1991, in the Federal Republic of Germany, the subject matter of which is incorporated herein by reference.

BACKGROUND OF THE INVENTION

1. Field of the Invention

The present invention relates to a method of operating a semiconductor laser as a mode-locked semiconductor laser and to devices for implementing the method.

2. Background Information

A semiconductor laser is disclosed, for example, in Electronics Letters 26 (1990), No. 4, pages 243-244. The semiconductor laser described there is monolithically integrated on an n-doped indium phosphide substrate. It includes a cavity that is disposed on the substrate above a plane that is coplanar to the base face of the substrate and forms a branched, linearly contiguous structure in that plane. The underside of the substrate is called the base surface. Above the indium phosphide substrate, there extends a likewise n-doped buffer layer of indium phosphide. The cavity composed of indium gallium arsenide phosphide (InGaAsP) is disposed on the planar surface of this buffer layer. The cavity is considered to be a "linearly contiguous" region in the sense of a topological definition since it is composed of a single piece having a single edge. In this case, the cavity has the shape of a "Y". Above the cavity further layers are provided. Together with the cavity they form a "Y" shaped mesa structure formed by etching above the buffer layer.

In addition, the phenomenon of mode locking is also known per se. Mode locking is understood to be a resonance-like phenomenon in which a semiconductor laser is modulated with an alternating current of a frequency that corresponds to the reciprocal of the round-trip time of a light pulse in the semiconductor laser. The active mode locking of semiconductor lasers is a technique which permits the generation of light pulses of very short duration. Such light pulses are significant for communication transmission systems operating in the gigahertz range. Mode-locked semiconductor lasers make it possible to transmit data at speeds which lie noticeably above the highest frequencies at which semiconductor lasers could be modulated directly according to prior art techniques.

For the transmission of communications, light pulses or trains of light pulses are delayed by different times in delay lines, are then modulated in modulators and combined into a multiplex frame. The light pulses of such semiconductor lasers can also be employed for measuring particularly if frequencies are to be measured that lie above 20 GHz. Moreover, such semiconductor lasers serve to actuate optical correlators for coding the addresses of individual bits or for coding bit groups (header coding).

The publication Appl. Phys. Lett. 57 (1990), pages 759-761, discloses an actively mode-locked semiconductor laser which is provided with a simple, unbranched cavity for propagation of the light pulses generated within it. The cavity is composed of layers composed alternatingly of indium gallium arsenide phosphide and indium gallium arsenide (that is, a quantum well layer sequence). The cavity is divided into five regions; two regions adjacent the resonator end faces serve as modulators through which flows an alternating current; one region in the middle of the cavity serves as a saturable absorber; and two regions between the modulators and the absorber serve as active waveguides.

SUMMARY OF THE INVENTION

It is an object of the invention to provide a method of operating a semiconductor laser of the above-mentioned type as a mode-locked semiconductor laser which can be employed in many ways for the optical transmission of communications.

It is a further object of the invention to provide devices with which the method can be implemented. These objects are accomplished according to an embodiment of the invention in which a semiconductor laser, including a branched cavity that extends over at least four individually actuatable regions, is operated as a mode-locked laser, wherein in addition to a direct current which is greater than a transparency current, an alternating current flows through at least one of the regions, the amplitude of the alternating current together with the direct currents exceeds the laser threshold current and the frequency of the alternating current corresponding to the reciprocal of the round-trip time of light pulses generated in the cavity by the alternating current.

The method permits the formation of light pulses of a narrow width and high optical power. For example, light pulses may be generated simultaneously in two regions of the cavity and thereafter may be superposed on one another in a further region. On the other hand, it is possible to generate light pulses alternatingly in two regions in that the alternating current is fed to the one region without a phase shift and to the other region with a phase shift of $\pi$. In that way, light pulses of a frequency that is twice the frequency of the alternating current can be generated in the adjacent region.

The method can be used to advantage in a semiconductor laser if the latter is employed in conjunction with a multiplexer or demultiplexer to generate short light pulses.

BRIEF DESCRIPTION OF THE DRAWINGS

Embodiments of the invention will now be described with reference to the drawing figures in which.

DETAILED DESCRIPTION OF THE PREFERRED EMBODIMENTS

Figure 1:
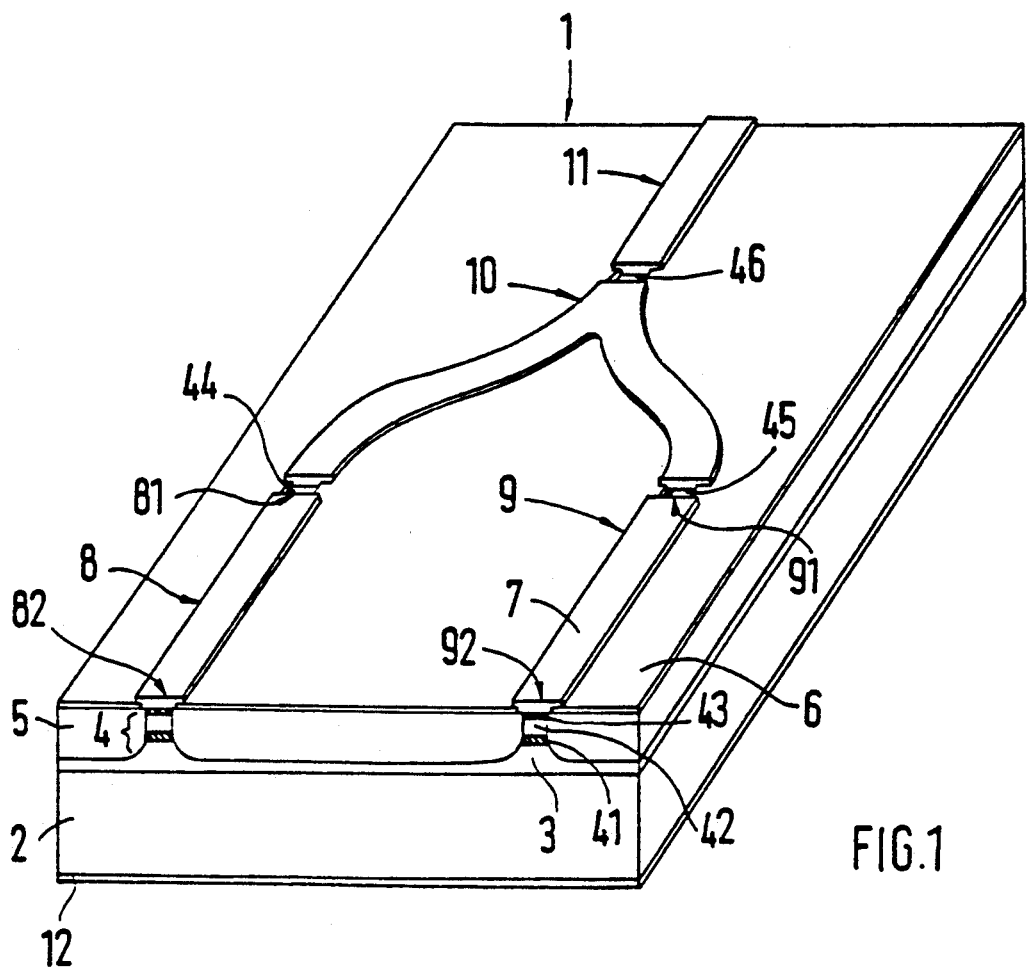
FIG. 1 depicts a semiconductor laser.

FIG. 1 shows a semiconductor laser 1. It includes a substrate 2 of n-doped indium phosphide. Above it lies a buffer layer 3 which is likewise composed of n-doped indium phosphide and part of which forms the lowermost layer of a mesa 4 that has the shape of a "Y". Mesa 4 is composed of several layers. It includes a cavity 41 of indium gallium arsenide phosphide. This cavity is covered by a cladding layer 42 of p-doped indium phosphide. Above it lies a contact layer 43 of p+-doped indium gallium arsenide.

Instead of cavity 41, a quantum well layer sequence may also be provided as disclosed, for example, in Appl. Phys. Lett 39 (1981), pages 786-788.

The semiconductor laser 1 may also be constructed as a GaAlAs/GaAs semiconductor laser; such a structure is disclosed, for example, in Appl. Phys. Lett. 52 (1988), pages 767-769.

On the side of mesa 4 and above the surface of buffer layer 3 not covered by cavity 41, a layer 5 of semi-insulating indium phosphide is provided for electrical insulation; its upper surface forms a plane with the upper surface of contact layer 43. Layer 5 is covered with a protective layer 6 of silicon dioxide, contact layer 43 is covered with a metal layer 7.

Three troughs 44, 45 and 46 are etched into metal layer 7, dividing it into four regions 8, 9, 10 and 11. As shown in FIG. 1, troughs 44, 45, and 46 may also extend down into cladding layer 42 but not into cavity 41. Troughs 44 to 46 also divide mesa 4 into four regions 8, 9, 10 and 11. Regions 8 and 9 extend next to one another. At one of their ends 81 and 91, respectively, they are each adjacent to a branched region 10. In each region 8 to 11, metal layer 7 forms a first electrode. A second electrode is formed jointly for all regions 8 to 11 by a metal layer 12 which is applied below substrate 2.

Figure 2A:
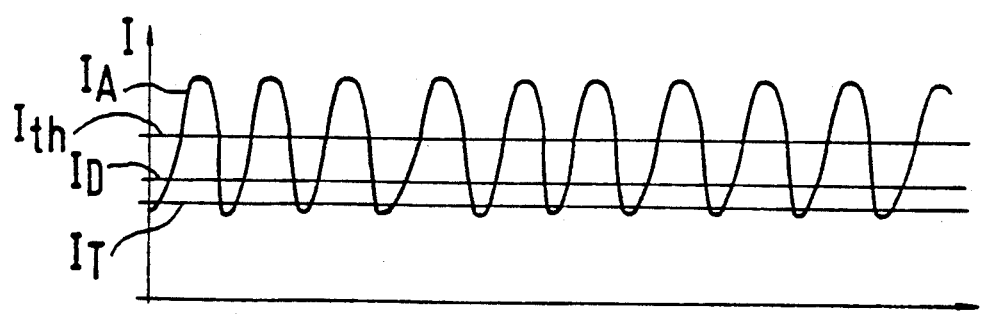
FIG. 2a depicts the current flowing through at least one of the regions of the semiconductor laser as a function of time.

According to a first embodiment of the method, a direct current $I_D$ (FIG. 2A) flows through each region 8, 9, 10 and 11; the value of this current lies above the threshold at which the respective region 8, 9, 10, and 11, becomes transparent for light of the wavelength propagating in cavity 41. The current corresponding to this threshold is called the transparency current $I_T$. However, direct current $I_D$ is smaller in each case than the laser threshold current $I_{th}$. The direct currents $I_D$ in regions 8 to 11 are not necessarily identical, but can be freely selected individually within these limits. They can also be varied during operation of semiconductor laser 1.

Figure 2B:
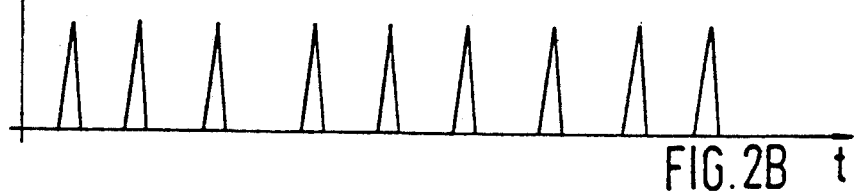
FIG. 2b depicts the light pulses generated by the current.

In addition, an alternating current $I_A$ that is superposed on direct current $I_D$ flows through region 11. Alternating current $I_A$ is an essentially sinusoidal current that has an amplitude which, when added to direct current $I_D$, is sufficient to exceed the level of laser threshold current $I_{th}$ in region 11. In this way, light is coherently amplified pulse by pulse. Light pulses are generated (FIG. 2B). The frequency of alternating current $I_A$ is selected so that it corresponds to the reciprocal of the round-trip time of each light pulse between region 11, region 10 and region 8. This round-trip time corresponds to the round-trip time between region 11, region 10 and region 9. The frequency of alternating current $I_A$ may also be an integral multiple of this frequency.

Figure 1A:
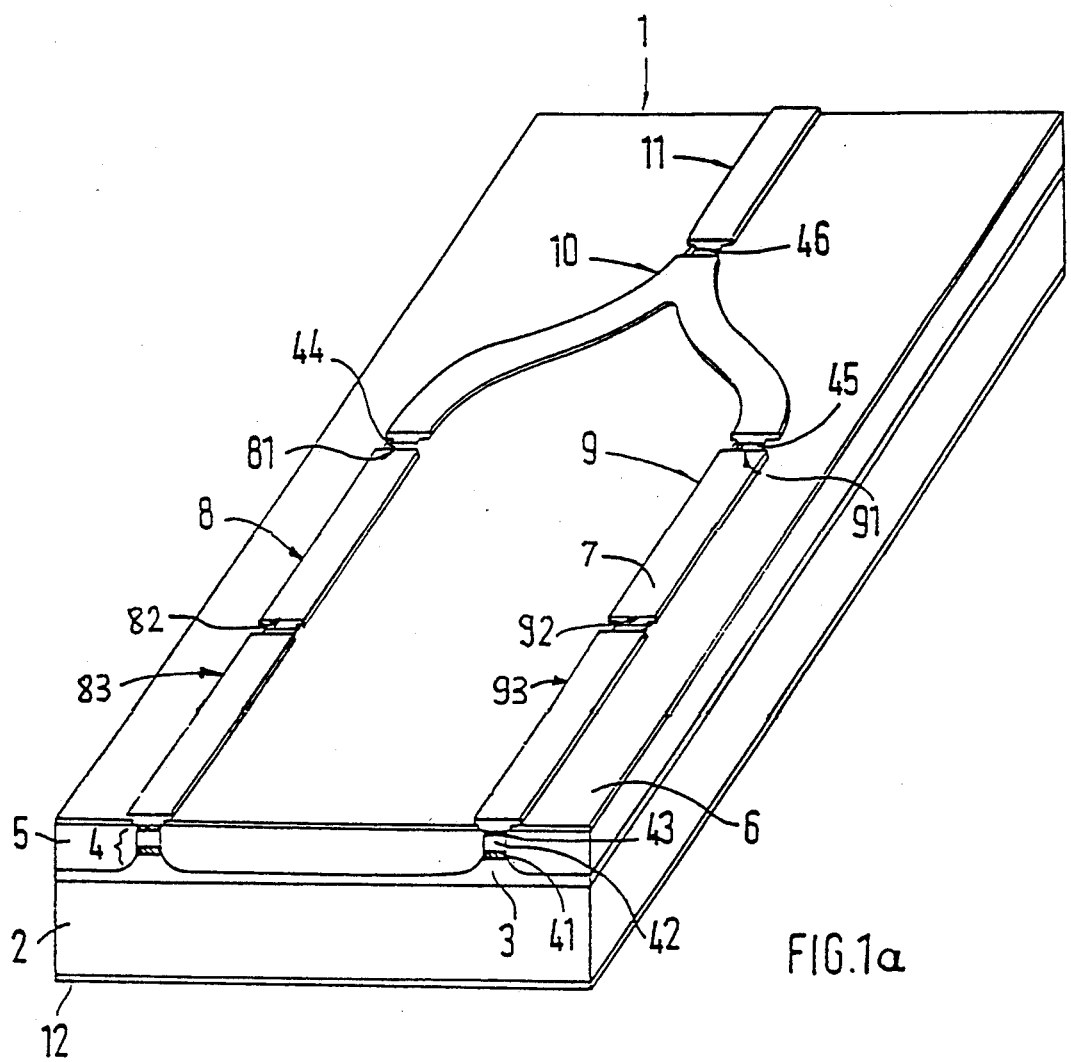
FIG. 1a depicts an alternate embodiment of a semiconductor laser.

It is of advantage for the light pulses generated in region 11, after passing through region 10 and region 8 or after passing through region 10 and region 9, to each pass through a further region that follows the respective other end 82 and 92 of region 8 and 9 (shown in FIG. 1a), with these regions 83 and 93 each serving as a saturable absorber. No direct current $I_D$ flows through it. For example, a voltage in the reverse direction is present across this absorber. These regions each serve to make the light pulses more narrow. However, they may also be actuated in such a way that light pulses are attenuated or even entirely suppressed. It is thus possible to modulate a train of light pulses according to a predetermined signal.

In a second embodiment a direct current $I_D$ again flows through regions 8, 9 and 10; an alternating current $I_A$ flows through each of regions 8 and 9 so that in-phase light pulses are generated in each of them when laser threshold current $I_{th}$ is exceeded. The light pulses generated in regions 8 and 9 converge in the portion of region 10 that is adjacent to region 11. Thus light pulses can be generated in semiconductor laser 1 with an amplification that lies above the maximum amplification that can be generated individually in each one of regions 8 and 9. Region 11 serves as saturable absorber.

Thus the light pulses from region 11 emitted from semiconductor laser 1 have an amplitude that is greater than light pulses that could be emitted individually from regions 8 and 9 of the semiconductor laser. For example, the amplitude is up to 30% greater.

In a third embodiment, the light pulses in regions 8 and 9 are generated in phase opposition, that is, in contrast to the preceding embodiment, not in phase but with a phase offset $\pi$, in that the alternating current $I_A$ flowing through region 8 is offset in phase by $\pi$ relative to the alternating current $I_A$ flowing through region 9. This method permits the simultaneous emission of light pulses whose repetition rate corresponds to the single frequency o the double frequency of alternating current $I_A$. The light pulses of the single repetition rate are emitted alternatingly from regions 8 and 9 of semiconductor laser 1, the light pulses of the double repetition rate are emitted from region 11.

In the above described embodiments cavity 41 has a composition in all regions 8 to 11, for example, of $In_{0.62}Ga_{0.38}As_{0.82}P_{0.18}$ in which case semiconductor laser 1 emits light pulses in a wavelength range around 1520 nm.

If the cavity in regions 8, 9 and 10 according to the first embodiment or cavity 41 in region 10 according to the second and third embodiments has a composition of, for example, $In_{0.57}Ga_{0.43}As_{0.73}P_{0.27}$ it is transparent for light pulses of a wavelength from the wavelength range around 1300 nm without these light pulses being absorbed to a great extent. In these cases, cavity 41 forms a passive waveguide in regions 8, 9 and 10 or only in region 10, respectively, through which no direct current $I_D$ flows. Above cavity 41, if the latter serves as a passive waveguide, there exists either cladding layer 42 and contact layer 43 or layer 5 extends also above cavity 41.

In a fourth embodiment cavity 41 is configured as a passive waveguide exclusively in region 9 while, as described in connection with the first embodiment, direct current $I_D$ flows through regions 8, 10 and 11. In region 1; the light pulses are generated by alternating current $I_A$. In this embodiment, it is easy to produce differences in the travel times of the light pulses in regions 8 and 9. If the light pulses traveling back from these regions to region 11 are superposed in region 10, they each form a light pulse which has less of a width than the light pulses coming from regions 8 and 9. Region 9 may also have the same layer structure as regions 8, 10 and 11 and in that case can be operated as a saturable absorber.

It will be understood that the above description of the present invention is susceptible to various modifications, changes and adaptations, and the same are intended to be comprehended within the meaning and range of equivalents of the appended claims.

What is claimed is:

1. A method of operating a semiconductor laser including a branched cavity that extends over at least four individually actuatable regions, as a mode-locked semiconductor laser, the method comprising:

providing a direct current to at least one of said regions, said direct current being greater than a transparency current; and providing an alternating current through said at least one of said regions, the amplitude of said alternating current together with the amplitude of said direct current exceeding a laser threshold current, said alternating current having a frequency related to the reciprocal of the round-trip time of light pulses generated in said cavity by said alternating current.

2. A method according to claim 1, wherein said frequency of said alternating current corresponds to the reciprocal of an integral multiple of the round-trip time of said light pulses generated in said cavity by said alternating current.

3. A method according to claim 1, wherein said four individually actuatable regions of said laser include a first region and a second region which extend alongside one another and are each adjacent at one end to a branched third region which is adjacent to a fourth region at an opposite end thereof, said regions thereby forming a segmented Y configuration.

4. A method according to claim 3, wherein said third region is not provided with current, and wherein the portion of said cavity disposed over said third region is made transparent to light pulses from said first region, said second region and said fourth region.

5. A method according to claim 3, wherein different direct currents are provided to each one of said first region, said second region, said third region and said fourth region.

6. A method according to claim 5, wherein said light pulses are generated in said fourth region.

7. The method according to claim 6, wherein said laser is provided with a fifth region and a sixth region disposed adjacent to second ends of said first region and of said second region respectively, said cavity extending over said fifth and sixth regions, said fifth and sixth regions each forming a saturable absorber.

8. A method according to claim 7, wherein said fifth region and said sixth region are not provided with current.

9. A method according to claim 7, wherein a reverse bias voltage is provided across said fifth and said sixth regions.

10. A method according to claim 3, wherein direct currents are provided through said first region, said second region and said third region, said fourth region serving as a saturable absorber, and in-phase light pulses are generated by said alternating current in said first region and in said second region.

11. A method according to claim 3, wherein direct currents are provided through said first region, said second region and said third region, said fourth region serving as a saturable absorber, and said alternating current is made to generate light pulses with a phase shift of $\pi$ in said first region and in said second region.

12. A method according to claim 7, wherein at least one of said fifth and sixth regions operated as a saturable absorber is employed to modulate a train of light pulses generated by said semiconductor laser.

* * * * *